United States Patent [19]

Urai

[11] Patent Number: 4,881,200

[45] Date of Patent: Nov. 14, 1989

[54] ERASABLE PROGRAMMABLE READ ONLY MEMORY DEVICE

[75] Inventor: Takahiko Urai, Tokyo, Japan

[73] Assignee: NEC Corporation, Tokyo, Japan

[21] Appl. No.: 261,287

[22] Filed: Oct. 24, 1988

[30] Foreign Application Priority Data

Oct. 22, 1987 [JP] Japan ................................ 62-267797

[51] Int. Cl.⁴ .......................... G11C 7/00; G11C 8/00; G11C 7/02

[52] U.S. Cl. ........................... 365/189.04; 365/230.03; 365/200; 365/210; 365/189.05

[58] Field of Search ............ 365/210, 94, 200, 189.01, 365/189.04, 189.05, 230.01, 230.03, 233

[56] References Cited

U.S. PATENT DOCUMENTS

| | | | |
|---|---|---|---|
| 4,656,610 | 4/1987 | Yosahida et al. | 365/230.03 |
| 4,701,887 | 10/1987 | Ogawa | 365/189.05 |
| 4,719,602 | 1/1988 | Hag et al. | 365/189.05 |
| 4,757,474 | 7/1988 | Fukushi et al. | 365/230.03 |

Primary Examiner—Stuart N. Hecker
Assistant Examiner—Melissa J. Koval
Attorney, Agent, or Firm—Sughrue, Mion, Zinn, Macpeak & Seas

[57] ABSTRACT

There is disclosed an erasable programmable read only memory device shifted into one of a write-in mode of operation, a read-out mode of operation and a diagnostic mode of operation, the memory device comprises a plurality of input data distributing circuits each provided in association with each memory cell array and operative to simultaneously transfer a data bit to a first write-in circuit for the memory cell array and to a second write-in circuit for a redundant memory cell array in the diagnostic mode of operation, so that the data bit is simultaneously written into both of the memory cell and the redundant memory cell, thereby decreasing the time period consumed in the diagnostic mode of operation.

9 Claims, 4 Drawing Sheets

FIG 1
PRIOR-ART

FIG.4

ERASABLE PROGRAMMABLE READ ONLY MEMORY DEVICE

FIELD OF THE INVENTION

This invention relates to an erasable programmable read only memory device and, more particularly, to diagnostic supporting circuit incorporated therein for reduction in time period consumed in a diagnostic operation.

BACKGROUND OF THE INVENTION

Research and development efforts are made for semiconductor memory devices with high integration density. One of the approaches to increase the integration density is to miniaturize each memory cell to reduce the occupation area. However, a problem is encountered in reduction in production yield due to, for example, lattice defects. The higher integration density the semiconductor memory device has, the more memory cells each lattice defect influences. Moreover, the semiconductor memory device with higher integration density is more sensitive to irregulation of process parameters. Then, a rescue is required for enhancement of production yield. One of the rescue preparations is to provide redundant memory cells which are replaceable with a memory cell group including a defect memory cell. This rescue preparation is so effective that the redundant memory cells are widely applied to the semiconductor memory devices.

In a rewritable/erasable programmable read only memory device (which is frequently abbreviated as "EPROM"), defective bit lines occupy a substantial part of troubles as well as defective memory cells and defective word lines, so that several redundant memory cell groups respectively accompanied by bit lines are incorporated in the rewritable/erasable programmable read only memory devices for rescuing a considerable part of them from such troubles. This arrangement is hereinunder referred to as "bit-line redundancy", and, on the other hand, a plurality of redundant memory cell groups respectively accompanied by word lines are referred to as word-line redundancy. However, the bit-line redundancy is relatively complex in circuit arrangement with respect to the word-line redundancy, so that the word-line redundancy is widely applied to the semiconductor memory device rather than the bit-line redundancy. However, the word-line redundancy is less advantageous over the bit-line redundancy in read-out time, because the bit-line redundancy is usually accompanied by sense amplifiers and write-in circuits and, accordingly, no time delay due to replacement takes place in the read-out operation. Then, there is a trade-off between the complexity and the read-out time.

Figure 1:
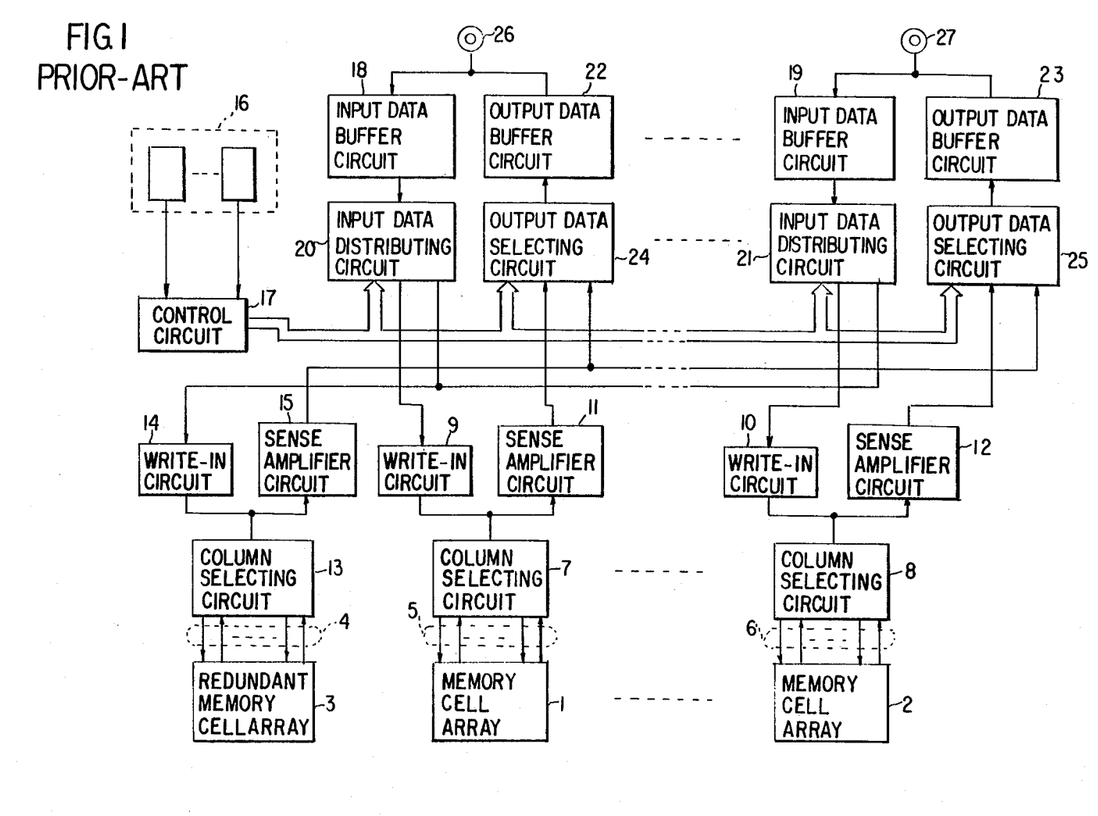
FIG. 1 is a block diagram showing the arrangement of a prior-art erasable programmable read only memory device.

A typical example of the rewritable/erasable programmable memory device with the bit-line redundancy is illustrated in FIG. 1 of the drawings. The rewritable/erasable programmable read only memory device largely comprises a plurality of memory cell arrays 1 to 2 each provided with memory cells arranged in rows and columns and a redundant memory cell array 3 arranged in rows and columns. Each of the memory cells is capable of storing a data bit of logic "1" or "0" level, and a plurality of memory cell columns are replaced with the redundant memory cell columns if necessary. Namely, when defective memory cells are detected during a diagnostic operation, the memory cell columns including the defective memory cells as a whole are replaced with the same number of the redundant memory cell columns and, then, data bits are written into or read out from the redundant memory cells instead of the replaced memory cells.

The memory cells or the redundant memory cells in each row is coupled to each word line (not shown), and each of bit lines 4, 5 and 6 is shared by the memory cells or the redundant memory cells. Though not shown in the drawings, a row address decoder circuit (not shown) is responsive to a row address signal and activates one of the word lines for specifying a row address assigned to the memory cells and the redundant memory cells. Each of the memory cell arrays 1 to 2 is coupled to a column selecting circuit 7 or 8 which selects a bit line from the bit lines 5 or 6 to provide a conduction path between the selected bit line and a write-in circuit 9 or 10 or a sense amplifier circuit 11 or 12. The redundant memory cell array 3 also is accompanied by a column selecting circuit 13 to transfer a data bit between a selected bit line and a write-in circuit 14 and a sense amplifier circuit 15.

When the memory cell columns are replaced with the redundant memory cell columns, the replacement is memorized into a non-volatile memory cell circuit 16 as a replacing information. The non-volatile memory cell circuit 16 provides the replacing information to a control circuit 17 which compares the replacing information with an address information represented by the address signal. If the address information specifies a memory cell column including at least one of the defective memory cells, the control circuit 17 produces a multi-bit control signal.

The rewritable/erasable programmable read only memory device further comprises a plurality of input data buffer circuits 18 to 19 associated with input data distributing circuits 20 to 21, respectively, and output data buffer circuits 22 to 23 respectively associated with output data selecting circuits 24 to 25. Each of the input data buffer circuits 18 to 19 is paired with each of the output data buffer circuits 22 to 23 to form a combination circuit which is coupled to each of input/output data terminal 26 to 27.

In a write-in operation, a row address signal and a column address signal are supplied to the rewritable/erasable programmable read only memory device in succession. The row address decoder circuit (not shown) activates one of the word lines on the basis of the row address signal. Each of the column selecting circuits 7 to 8 provides the conduction path between one of the memory cell columns and the write-in circuit 9 or 10 specified by the column address signal, and the control circuit 17 compares the address information with the accessed column address specified by the column address signal. If the memory cell column specified by the column address signal is replaced with one of the redundant memory cell columns, the multi-bit control signal is supplied from the control circuit 17 to the input data distributing circuits 20 to 21 to cause one of the input data distributing circuits 20 to 21 to provide a conduction path to the write-in circuit 14 instead of a conduction path to the write-in circuit 9 or 10 associated with the memory cell array with the defective memory cell or cells. In this situation, an input data bit supplied to one of the input/output data terminals for the defective memory cell is transferred from the input data distributing circuit 20 or 21 to the write-in circuit 14 associated with the redundant memory cell array 3, but the other data bits supplied to the other input/output data terminals are transferred from the input data distributing circuits to the write-in circuits associated with the memory cell arrays. Thus, a set of the input data bits are written into the memory cell arrays and the redundant memory cell array.

On the other hand, when the rewritable/erasable programmable read only memory device is shifted to a read-out operation, the multi-bit control signal is supplied from the control circuit 17 to the output data selecting circuits 24 to 25. Then, the output data selecting circuits 24 to 25 allows the output data bits read out from the perfect memory cells from the sense amplifier circuits to the output data buffer circuits, but no conduction path is established from the sense amplifier circuit associated with the memory cell array including the defective memory cell or cells. However, the output data selecting circuit transfers the data bit read out from the redundant memory cell array 3 to the output data buffer circuit, so that a set of the data bits without false data information bit are supplied to the input/output data terminals 26 to 27.

However, a problem is encountered in the prior-art rewritable/erasable programmable read only memory device in diagnostic operation for the memory cell arrays and the redundant memory cell array. In the diagnostic operation, the input data bits are written into not only the memory cells but also the redundant memory cells. However, as described above, an input data bit is written into either memory cell or redundant memory cell depending upon the multi-bit control signal. Especially, the rewritable/erasable programmable read only memory device consumes several hundred microseconds to write a byte of data bits into the memory cells or the redundant memory cells. Then, a prolonged time period is consumed for the diagnostic operation, and, for this reason, the diagnostic expenses become large in the production cost of the high-integration density rewritable/erasable programmable read only memory device.

SUMMARY OF THE INVENTION

It is therefore an important object of the present invention to provide an erasable programmable read only memory device which decreases the time period consumed in the diagnostic operation.

To accomplish these objects, the present invention proposes to simultaneously write a data bit into both of the memory cell and the redundant memory cell during a single write-in operation.

In accordance with the present invention, there is provided an erasable programmable read only memory device capable of being shifted into an operation selected from the group of a write-in mode of operation, a read-out mode of operation and a diagnostic mode of operation, comprising (a) a plurality of memory cell arrays each having a plurality of memory cells arranged in memory cell rows and memory cell columns, each of the memory cells being capable of memorizing a data bit in a rewritable and non-volatile manner, (b) at least one redundant memory cell array having a plurality of redundant memory cells arranged in redundant memory cell rows and redundant memory cell columns, each of the memory cells being capable of memorizing a data bit in the rewritable and non-volatile manner, the memory cell columns being replaceable with the redundant memory cell columns, respectively, (c) a plurality of first write-in circuits each provided in association with each of the memory cell arrays and operative to write a data bit into a memory cell selected from the memory cell array, (d) at least one second write-in circuit provided in association with the redundant memory cell array and operative to write a data bit into a redundant memory cell selected from the redundant memory cell array, (e) a plurality of first sense amplifier circuits each provided in association with each of the memory cell arrays and operative to quickly decide the logic level of the data bit read out from the memory cell selected from the memory cell array, (f) at least one second sense amplifier circuit provided in association with the redundant memory cell array and operative to quickly decide the logic level of the data bit read out from the memory cell selected from the redundant memory cell array, (g) a plurality of first column selecting circuits each provided in association with each of the memory cell arrays and operative to provide a data path between one of the memory cell columns selected from the memory cell array and one of each first writein circuit and each first sense amplifier circuit depending upon the operation to which the erasable programmable read only memory device is shifted, (h) at least one second column selecting circuit provided in association with the redundant memory cell array and operative to provide a data path between one of the redundant memory cell columns selected from the redundant memory cell array and one of the second write-in circuit and the second sense amplifier circuit depending upon the operation to which the erasable programmable read only memory device is shifted, (i) programmable link means operative to memorize a replacement between the memory cell columns and the redundant memory cell columns and providing a replacing information, (j) a control circuit operative to compare the memory cell column selected from the memory cell columns with the memory cell column replaced with the redundant memory cell column on the basis of the replacing information and produce a multi-bit control signal if these memory cell columns are identical with each other, (k) a plurality of input/output data buffer circuits each provided in association with each of the memory cell arrays and operative to temporally store the data bit read out from or written into the memory cell selected from the memory cell array, (l) a plurality of output data selecting circuits each provided in association with each of the memory cell arrays and activated in the read-out mode of operation, each of the output data selecting circuits being operative to transfer the data bit read out from the memory cell selected from the memory cell array in the absence of the multi-bit control signal but transfer the data bit read out from the redundant memory cell selected from the redundant memory cell array in the presence of the multi-bit control signal, (m) a plurality of input data distributing circuits each provided in association with each of the memory cell arrays and activated in the write-in mode of operation and the diagnostic mode of operation, each of the input data distributing circuits being operative to transfer the data bit stored in each input/output data buffer circuit to the first write-in circuit in the absence of the multi-bit control signal but transfer the data bit to the second write-in circuit when the erasable programmable read only memory device is shifted into the write-in mode of operation, and (n) a mode signal producing circuit operative to produce a mode signal representative of the diagnostic mode of operation when the erasable programmable read only memory device is shifted into the diagnostic mode of operation, wherein one of the input data distributing circuits is responsive to the mode signal and transfer the data bit stored in the input/output data buffer circuit to both of the first and second write-in circuits.

BRIEF DESCRIPTION OF THE DRAWINGS

The features and advantages of an erasable programmable read only memory device according to the present invention will be more clearly understood from the following description taken in conjunction with the accompanying drawings in which.

DESCRIPTION OF THE PREFERRED EMBODIMENTS

First embodiment

Figure 2:
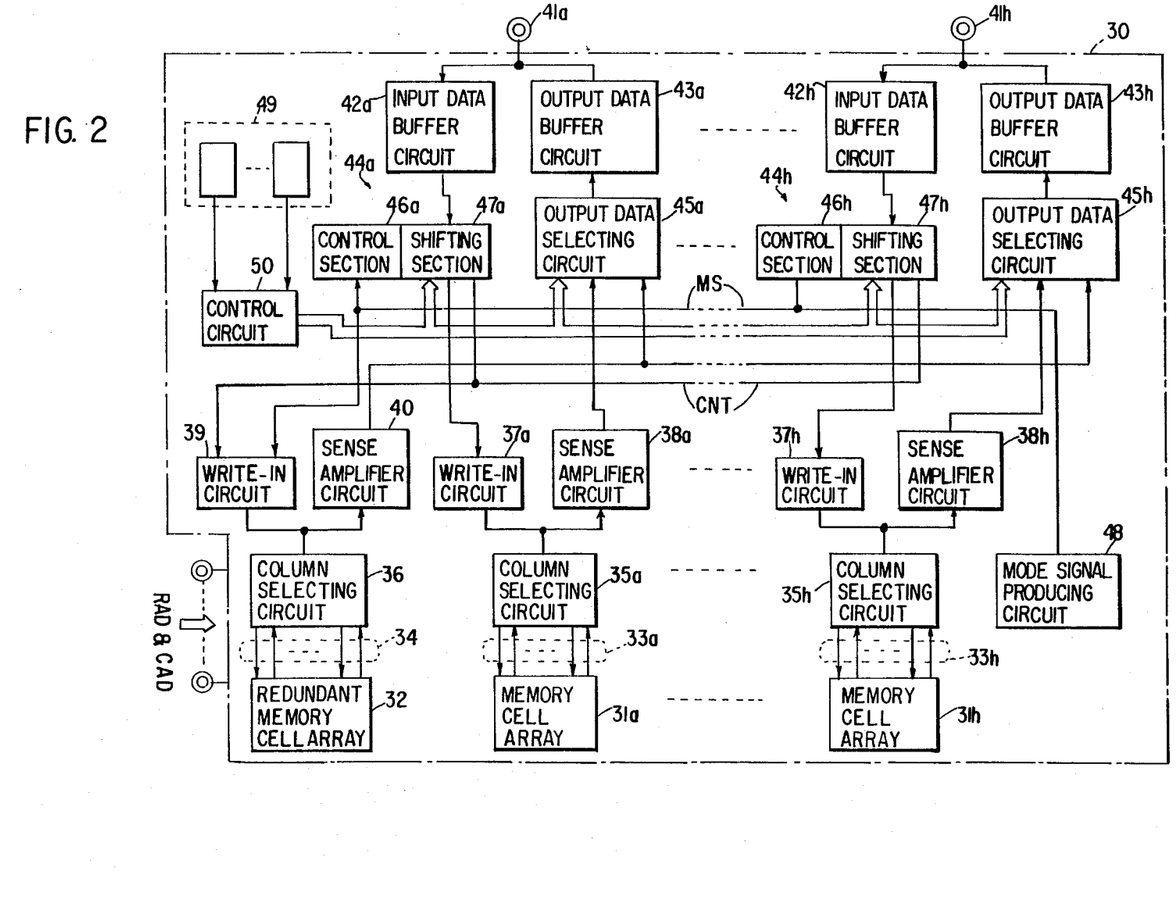
FIG. 2 is a block diagram showing the arrangement of an erasable programmable read only memory device embodying the present invention.

Referring first to FIG. 2 of the drawings, there is shown an non-volatile semiconductor memory device of an EPROM type fabricated on a single semiconductor chip 30. The semiconductor memory device largely comprises eight memory cell arrays 31a to 31h each arranged in rows and columns, and a redundant memory cell array 32 which is also arranged in rows and columns. The memory cells in a row and the memory cells in a column are hereinunder referred to as "memory cell row " and "memory cell column ", respectively, and the redundant memory cells in a row and the redundant memory cells in a column are referred to as "redundant memory cell row "and " redundant memory cell column " for the sake of simplicity. The semiconductor memory device shown in FIG. 2 is capable of being shifted into a write-in mode of operation, a read-out mode of operation or a diagnostic mode of operation. In the write-in mode of operation, eight data bits are written into eight memory cells each selected from each memory cell array for memorization, and the data bits are retrieved from the memory cells. However, if memory cells in one of the memory cell arrays 31a to 31h are defective, the memory cell columns with the defective memory cells are replaced with the redundant memory cell columns, so that the write-in operation and the read-out operation are carried out to the redundant memory cell instead of the defective memory cell.

Though not shown in the drawings, the semiconductor memory device is provided with a plurality of word lines each shared by the memory cell rows each selected from each memory cell array and each redundant memory cell row. All of the word lines are coupled to a row address decoder circuit (not shown) which activates one of the word lines on the basis of a row address signal RAD supplied from the outside thereof. When the word line is activated by the row address decoder circuit, all of the memory cells and the redundant memory cells are shifted into accessible state.. On the other hand, the memory cell columns of the memory cell array 31a are respectively coupled to bit lines 33a, and the memory cell columns of each memory cell array such as 31h are similarly associated with bit lines such as 33h. In the redundant memory cell array 32, bit lines 34 are also shared by the redundant memory cell columns, respectively. The bit lines 33a to 33h and 34 are respectively coupled to column selecting circuits 35a to 35h and 36, and each of the column selecting circuits 35a to 35h and 36 propagates the data bit supplied from one of the memory cell columns of each memory cell array or one of the redundant memory cell columns on the basis of a column address signal CAD.

The column selecting circuits 35a to 35h and 36 are respectively coupled to write-in circuits 37a to 37h and 39 and sense amplifier circuits 38a to 38h and 40 the former of which are provided for the write-in operations into the memory cells and the redundant memory cell but the latter of which respectively decide the logic levels of the respective data bits read out from the memory cells and the redundant memory cell.

The semiconductor memory device further comprises eight input/output data terminals 41a to 41h which are coupled in parallel to input data buffer circuits 42a to 42h and output data buffer circuits 43a to 43h, respectively. The input data buffer circuits 42a to 42h are respectively associated with input data distributing circuits 44a to 44h, and the output data buffer circuits 43a to 43h are coupled to output data selecting circuits 45a to 45h, respectively. The sense amplifier circuits 38a to 38h are coupled in parallel to the output data selecting circuits 45a to 45h, but the sense amplifier circuit 40 is coupled to all of the output data selecting circuits 45a to 45h. Thus, a data propagation path is capable of establishing from each memory cell array or the redundant memory cell array 32 through each of the column selecting circuits 35a to 35h or 36, each of the sense amplifier circuits 38a to 38h or 40, each output data selecting circuit and each output data buffer circuit to each of the input/output data terminals 41a to 41h.

The input data distributing circuits 44a to 44h are provided with control sections 46a to 46h and shifting sections 47a to 47h, respectively, and the control sections are responsive to a mode signal MS representative of the diagnostic mode of operation which is produced by a mode signal producing circuit 48 for a simultaneous write-in operation. The mode signal MS is further supplied to the write-in circuit 39 for activation in the diagnostic mode of operation, and detailed description is made for the mode signal producing circuit 48 with reference to FIG. 3. For memorization of replacement with redundant memory cell columns, there is provided a programmable link arrangement such as a fuse array or a non-volatile memory circuit 49 which memorizes the address locations of the memory cell columns including the defective memory cells, and the address locations are supplied to a control circuit 50 for comparing with the column address location represented by the column address signal. When one of the address locations is identical with the column address locations, the control circuit 50 produces a multi-bit control signal CNT supplied in parallel to all of the shifting sections 47a to 47h and all of the output data selecting circuits 45a to 45h for steering the input data bits and selection of the data bits read out from the memory cell arrays 31a to 31h and the redundant memory cell array 32. The multi-bit control signal CNT has a bit RA representative of the replacement. Namely, when the defective memory cell is accessed, one of the output data selecting circuits 45a to 45h is responsive to the multi-bit control signal CNT and, accordingly, transfers the data bit read out from the redundant memory cell to the output data buffer circuit instead of the data bit read out from the defective memory cell in the read-out mode of operation. However, if the semiconductor memory device is shifted to the write-in mode of operation, one of the shifting sections 47a to 47h distributes the input data bit to the write-in circuit 39 in the presence of the multi-bit control signal CNT.

Figure 3:
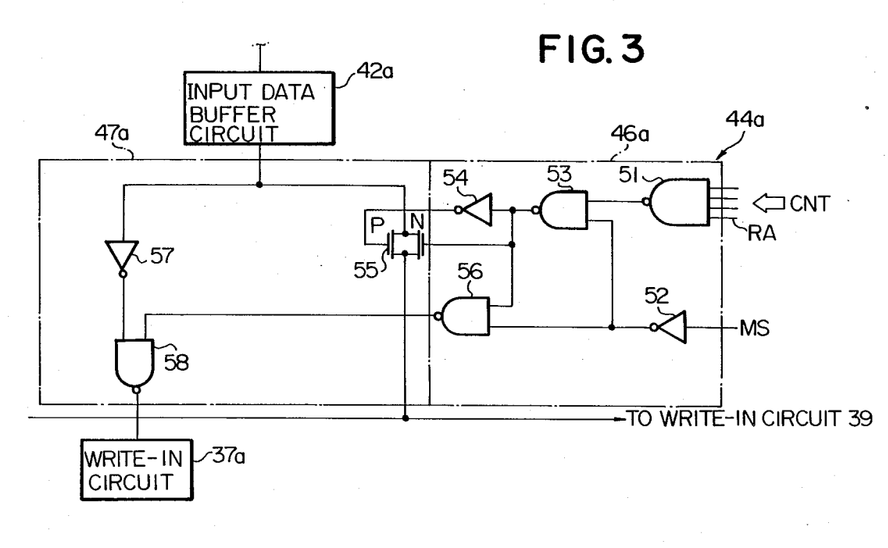
FIG. 3 is a diagram showing the circuit arrangement of an input data distributing circuit incorporated in the erasable programmable read only memory device shown in FIG. 2.

Turning to FIG. 3 of the drawings, the circuit arrangement of each input data distributing circuit is illustrated in detail. All of the input data distributing circuits 44a to 44h are similar in circuit arrangement to one another, so that the description is made for the input data distributing circuit 44a only.

The input data distributing circuit 44a comprises a NAND gate 51 having four input nodes applied with the multi-bit control signal CNT, an inverter circuit 52 supplied with the mode signal MS, a NAND gate 53 having two input nodes coupled to the NAND gate 51 and the inverter circuit 52, respectively, an inverter circuit 54 coupled to the NAND gate 53, a transfer gate 55 provided with a p-channel type field effect transistor gated by the inverter circuit 54 and an n-channel type field effect transistor directly gated by the NAND gate 53, a NAND gate 56 having two input nodes respectively coupled to the NAND gate 53 and the inverter circuit 52, an inverter circuit 57, and a NAND gate 58 having two input nodes coupled to the inverter circuit 57 and the NAND gate 56, respectively. The NAND gates 51, 53 and 56 and the inverter circuits 52 and 54 as a whole constitutes the control section 46a, and the transfer gate 55, the inverter circuit 57 and the NAND gate 58 form in combination the shifting section 47a.

In the write-in mode of operation, if no defective memory cell is accessed to write the data bit therein, at least one bit RA of the multi-bit control signal CNT is in the inactive low level, so that the NAND gate 51 produces an output signal of the high level. The mode signal MS is in the inactive low level, then the inverter circuit 52 produces an output signal of high level. Thus, the output signals in the high levels are supplied to the NAND gate 53, and, for this reason, an output signal of the low level is supplied in parallel to the inverter circuit 54 and the NAND gate 56. With the output signal of the low level, the inverter circuit 54 produces an output signal of the high level. The output signal of the NAND gate 53 and the inverse thereof are respectively supplied to the n-channel type field effect transistor and the p-channel type field effect transistor, so that the transfer gate 55 blocks a data path between the input data buffer circuit 42a and the write-in circuit 39. However, with the low level output signal of the NAND gate 53 and the high level output signal of the inverter circuit 52, the NAND gate 56 produces an output signal of the high level which is supplied to the NAND gate 58 for activation thereof. In this situation, when the input data bit of the high level is supplied from the input data buffer circuit 42a, the NAND gate 58 is supplied with the low level from the inverter circuit 57, thereby producing an output signal of the high level. However, the input data bit of the low level is supplied from the input data buffer circuit 42a to the inverter circuit 57, the NAND gate 58 produces the output signal of the low level. In this manner, the NAND gate 58 transfers the input data bit to the write-in circuit 37a.

On the other hand, if the bit RA is in the active high level and the memory cell array 31a is specified by the other bits of the multi-bit control signal CNT. All bits are in the active high levels, so that the NAND gate 51 produces the output signal of the low level. The mode signal MS is in the inactive low level, then the inverter circuit 52 produces the output signal of the high level. Thus, the output signals in the high level and the low level are supplied to the NAND gate 53, and, for this reason, an output signal of the high level is supplied in parallel from the NAND gate 53 to the inverter circuit 54 and the NAND gate 56. With the output signal of the high level, the inverter circuit 54 produces the output signal of the low level. The high level output signal of the NAND gate 53 and the inverse thereof are respectively supplied to the n-channel type field effect transistor and the p-channel type field effect transistor, so that the transfer gate 55 provides the data path between the input data buffer circuit 42a and the write-in circuit 39. Then, the input data bit is supplied from the input data buffer circuit 42a through the transfer gate 55 to the write-in circuit 39, and, for this reason, the input data bit is memorized in the redundant memory cell instead of the memory cell of the array 31a. However, with the high level output signal of the NAND gate 53 and the high level output signal of the inverter circuit 52, the NAND gate 56 produces the output signal of the low level which is supplied to the NAND gate 58 for inactivation thereof.

When the erasable programmable read only memory device is shifted into the diagnostic mode of operation, the mode signal producing circuit 48 allows the mode signal MS to go up to the active high level. Then, the inverter circuit 52 produces the output signal of the low level. If all bits of the control signal CNT are in the active high levels, the NAND gate 51 produces an output signal of the low level. Thus, the output signals in the high level and the low level are supplied to the NAND gate 53, and, for this reason, the output signal of the high level is supplied n parallel to the inverter circuit 54 and the NAND gate 56. With the output signal of the high level, the inverter circuit 54 produces the output signal of the low level. The high level output signal of the NAND gate 53 and the inverse thereof are respectively supplied to the n-channel type field effect transistor and the p-channel type field effect transistor, so that the transfer gate 55 provides the data path between the input data buffer circuit 42a and the write-in circuit 39. Then, the input data bit is supplied from the input data buffer circuit 42a through the transfer gate 55 to the write-in circuit 39, and, for this reason, the input data bit is memorized in the redundant memory cell. Moreover, with the high level output signal of the NAND gate 53 and the low level output signal of the inverter circuit 52, the NAND gate 56 produces the output signal of the high level which is supplied to the NAND gate 58 for activation thereof. In this situation, when the input data bit of the high level is supplied from the input data buffer circuit 42a, the NAND gate 58 is supplied with the low level from the inverter circuit 57, thereby producing an output signal of the high level. However, the input data bit of the low level is supplied from the input data buffer circuit 42a to the inverter circuit 57, the NAND gate 58 produces the output signal of the low level. In this manner, the NAND gate 58 transfers the input data bit to the write-in circuit 37a.

As will be understood from the foregoing description, the control section 46a is responsive to the mode signal as well as the multi-bit control signal CNT and causes the shifting section 47a to establish not only the data path between the input buffer circuit 42a and the write-in circuit 37a but also the data path between the input data buffer circuit 42a and the write-in circuit 39, thereby allowing the write-in circuits to simultaneously write the data bit into the memory cell and the redundant memory cell. The erasable programmable read only memory device consumes several hundred seconds for writing every data bit. Then, the simultaneous write-in operation is conducive to reduction in time period for diagnostic operation. This results in increasing the through-put of the diagnostic apparatus. As a result, the production cost is decreased.

Second embodiment

Figure 4:
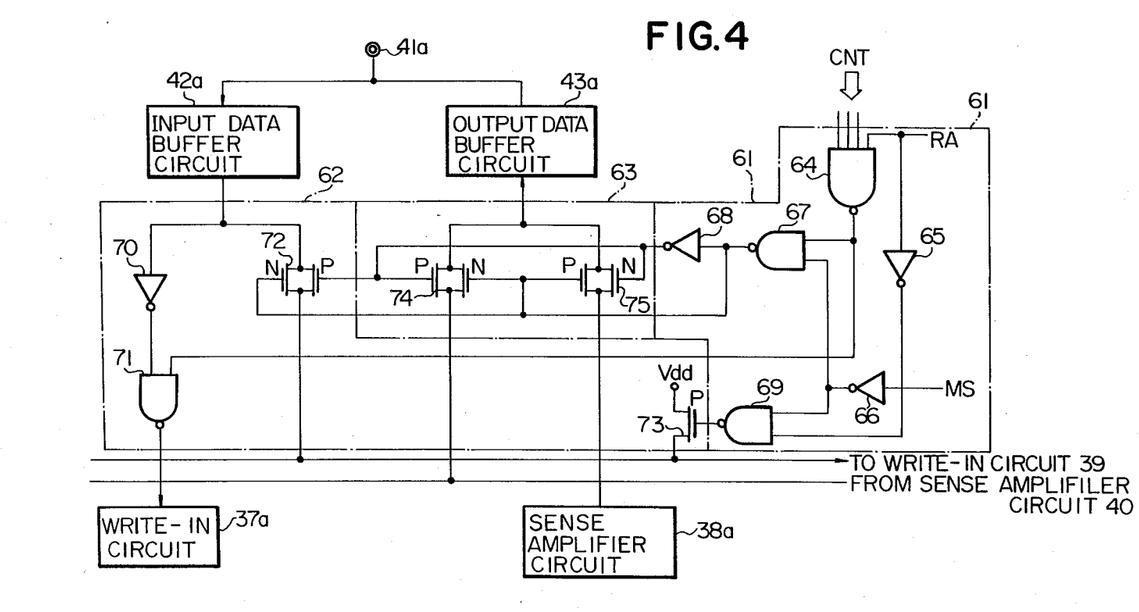
FIG. 4 is a diagram showing the circuit arrangement of another input data distributing circuit combined with an output data selecting circuit incorporated in an erasable programmable read only memory device embodying the present invention.

Turning to FIG. 4 of the drawings, there is shown the circuit arrangement of an input/output data circuit incorporated in another erasable programmable read only memory device according to the present invention. The erasable programmable read only memory device is similar in circuit arrangement to that illustrated in FIG. 2 except for the input/out put data circuits each provided in association with each of the memory cell array. Then, the description is focused upon one of the input/output data circuits with reference to FIG. 4. However, circuits, terminals and arrays are denoted by like reference numerals designating the corresponding circuits, terminals and arrays of the erasable programmable read only memory device shown in FIG. 2, and the description is omitted for the sake of simplicity.

The input/output data circuit comprises a control section 61, an input data shifting section 62 and an output data selecting section 63. In this instance, not only the input data shifting section 62 but also the output data selecting section 63 are controlled by the control section 61.

The control section 61 comprises a NAND gate 64 having input nodes supplied with all bits of the control signal CNT, an inverter circuit 65 supplied at the input node thereof with the bit RA of the control signal CNT, an inverter circuit 66 supplied at the input node thereof with the mode signal MS, a NAND gate 67 supplied at the input nodes thereof with output signals of the NAND gate 64 and the inverter circuit 66, an inverter circuit 68 supplied at the input node thereof with an out put signal of the NAND gate 67, and a NAND gate 69 supplied at the input nodes thereof with output signals of the inverter circuits 65 and 66.

The input data shifting section 62 comprises a series combination of an inverter circuit 70 and a NAND gate 71 coupled between the input data buffer circuit 42a and the write-in circuit 37a, a transfer gate 72 provided with an n-channel type field effect transistor and a p-channel type field effect transistor respectively gated by the NAND gate 67 and the inverter circuit 68, and a prohibiting transistor 73 of the p-channel type gated by the NAND gate 69.

On the other hand, the output data selecting section 63 comprises a transfer gate 74 coupled between the output data buffer circuit 43a and the sense amplifier circuit 40 and a transfer gate 75 coupled between the output data buffer circuit 43a and the sense amplifier circuit 38a.

In the write-in mode of operation, if no defective memory cell is accessed to write the data bit therein, at least one bit RA of the multi-bit control signal CNT is in the inactive low level, so that the NAND gate 64 produces the output signal of the high level. The mode signal MS is in the inactive low level, then the inverter circuit 66 produces the output signal of high level. Thus, the output signals in the high levels are supplied to the NAND gate 67, and, for this reason, the output signal of the low level is supplied to the inverter circuit 68. With the output signal of the low level, the inverter circuit 54 produces an output signal of the high level. The output signal of the NAND gate 67 is respectively supplied to the n-channel type field effect transistor of the transfer gates 72 and 74 and the p-channel type field effect transistor of the transfer gate 75, so that the transfer gates 72 and 74 block respective data paths between the input data buffer circuit 42a and the write-in circuit 39 and between the sense amplifier circuit 40 and the output data buffer circuit 43a. However, the high level output signal of the NAND gate 64 is supplied to the NAND gate 71 for activation, so that the data bit is supplied from the input data buffer circuit 42a to the write-in circuit 37a. This means that the data bit is not provided to the write-in circuit 39, but the write-in circuit 37a. The NAND gate 69 is supplied with the high level output signals from the inverter circuits 65 and 66, so that the transistor 73 remains in the off-state, thereby allowing the write-in circuit 39 to isolate from a source of high level Vdd.

On the other hand, if the bit RA is in the active high level and the memory cell array 31a is specified by the other bits of the multi-bit control signal CNT. All bits are in the active high levels, so that the NAND gate 64 produces the output signal of the low level. The mode signal MS is in the inactive low level, then the inverter circuit 66 produces the output signal of the high level. Thus, the output signals in the high level and the low level are supplied from the NAND gate 64 and the inverter circuit 66 to the NAND gate 67, and, for this reason, an output signal of the high level is supplied from the NAND gate 67 to the n-channel type field effect transistor of the transfer gate 72. With the output signal of the high level, the transfer gate 72 provides the data path between the input data buffer circuit 42a and the write-in circuit 39. However, the low level output signal is supplied from the NAND gate 64 to the NAND gate 71 for inactivation thereof, so that the data bit is transferred to the write-in circuit only. With the high level signal and the low level signal, the NAND gate 69 similarly allows the transistor 73 to remain off, inverter circuit 54 produces the output signal of the low level.

When the erasable programmable read only memory device is shifted in the read-out mode of operation, the control section 61 also responds to the multi-bit control signal CNT and the mode signal MS. If the output data selecting section 63 needs to transfer the data bit from the sense amplifier circuit 38a to the output data buffer circuit 43a provided in association with the memory cell array 31a, both of the multi-bit control signal CNT and the mode signal MS are shifted to the inactive low levels, so that the NAND gate 64 produces the output signal of the high level. With the high level signal from the inverter circuit 66 and the high level signal from the NAND gate 64, the NAND gate 67 produces the low level output signal and, accordingly, the inverter circuit 68 produces the high level signal. Then, the transfer gate 75 turns on to provide a data path between the sense amplifier circuit 38a to the output data buffer circuit 43a, but the transfer gate 74 remains off. As a result, the data bit is transferred from the sense amplifier circuit 38a to the output buffer circuit 43a, but no data bit is provided from the sense amplifier circuit 40. The NAND gate 69 is supplied with the high level output signals from the inverter circuits 65 and 66, so that the NAND gate 69 allows the transistor 73 to turn on for preventing the write-in circuit 39 from write-in operation.

On the other hand, if the output data selecting section 63 needs to provide a data path between the sense amplifier circuit 40 to the output data buffer circuit 43a, one of the multi-bit control signal CNT and the mode signal MS is shifted to the high level. Then, the NAND gate 67 is supplied with the high level signal and the low level signal, so that the high level output signal is supplied to the inverter circuit for producing the inverse thereof. In this situation, the transfer gate 74 turns on to provide the data path between the sense amplifier circuit 40 to the output data buffer circuit 43a, but the transfer gate 15 remains off to block the data path. Then, the data bit is transferred from the sense amplifier circuit 40 to the output data buffer circuit 43a, but no data bit is supplied from the sense amplifier circuit 38a.

When the erasable programmable read only memory device is shifted into the diagnostic mode of operation, the mode signal producing circuit 48 allows the mode signal MS to go up to the active high level. Then, the inverter circuit 66 produces the output signal of the low level. If all bits of the control signal CNT are in the inactive low levels, the NAND gate 64 produces the output signal of the high level which activates the NAND gate 71 to transfer the data bit from the input data buffer circuit 42a to the write-in circuit 37a. With the high level signal from the NAND gate 64 and the low level signal from the inverter circuit 66, the NAND gate 67 produces the high level output signal which is inverted by the inverter circuit 68. Then, the transfer gate 72 turns on to provide the data path between the input data buffer circuit 42a and the write-in circuit. Then, the input data bit is also supplied from the input data buffer circuit 42a through the transfer gate 72 to the write-in circuit 39, and, for this reason, the input data bit is simultaneously memorized in the redundant memory cell. Since the NAND gate 69 is provided with the high level signal from the inverter circuit 65 and the low level signal from the inverter circuit 66, the transistor 73 remains off with the high level output signal from the NAND gate 69.

Although particular embodiments of the present invention have been shown and described, it will be obvious to those skilled in the art that various changes and modifications may be made without departing from the spirit and scope of the present invention. For example, the mode signal producing circuit 48 supplies only one of the input data distribution circuits with the mode signal. Moreover, at least one of the input data distribution circuits is controlled by the control circuit if the non-volatile memory is limited in capacity.

WHAT IS CLAIMED IS:

1. An erasable programmable read only memory device capable of being shifted into an operation selected from the group of a write-in mode of operation, a read-out mode of operation and a diagnostic mode of operation, comprising:

(a) a plurality of memory cell arrays each having a plurality of memory cells arranged in memory cell rows and memory cell columns, each of said memory cells being capable of memorizing a data bit in a rewritable and non-volatile manner;

(b) at least one redundant memory cell array having a plurality of redundant memory cells arranged in redundant memory cell rows and redundant memory cell columns, each of said memory cells being capable of memorizing a data bit in the rewritable and nonvolatile manner, said memory cell columns being replacable with said redundant memory cell columns, respectively;

(c) a plurality of first write-in circuits each provided in association with each of said memory cell arrays and operative to write a data bit into a memory cell selected from the memory cell array;

(d) at least one second write-in circuit provided in association with said redundant memory cell array and operative to write a data bit into a redundant memory cell selected from the redundant memory cell array;

(e) a plurality of first sense amplifier circuits each provided in association with each of said memory cell arrays and operative to quickly decide the logic level of said data bit read out from the memory cell selected from the memory cell array;

(f) at least one second sense amplifier circuit provided in association with said redundant memory cell array and operative to quickly decide the logic level of said data bit read out from the memory cell selected from the redundant memory cell array;

(g) a plurality of first column selecting circuits each provided in association with each of said memory cell arrays and operative to provide a data path between one of said memory cell columns selected from the memory cell array and one of each first write-in circuit and each first sense amplifier circuit depending upon the operation to which said erasable programmable read only memory device is shifted;

(h) at least one second column selecting circuit provided in association with said redundant memory cell array and operative to provide a data path between one of said redundant memory cell columns selected from the redundant memory cell array and one of said second write-in circuit and said second sense amplifier circuit depending upon the operation to which said erasable programmable read only memory device is shifted;

(i) programmable link means operative to memorize a replacement between said memory cell columns and said redundant memory cell columns and providing a replacing information;

(j) a control circuit operative to compare the memory cell column selected from said memory cell columns with said memory cell column replaced with said redundant memory cell column on the basis of said replacing information and produce a multi-bit control signal if these memory cell columns are identical with each other;

(k) a plurality of input/output data buffer circuits each provided in association with each of said memory cell arrays and operative to temporally store the data bit read out from or written into the memory cell selected from said memory cell array;

(l) a plurality of output data selecting circuits each provided in association with each of said memory cell arrays and activated in said read-out mode of operation, each of said output data selecting circuits being operative to transfer the data bit read out from the memory cell selected from said memory cell array in the absence of said multi-bit control signal but transfer the data bit read out from the redundant memory cell selected from said redundant memory cell array in the presence of said multibit control signal;

(m) a plurality of input data distributing circuits each provided in association with each of said memory cell arrays and activated in said write-in mode of operation and said diagnostic mode of operation, each of said input data distributing circuits being operative to transfer the data bit stored in each input/output data buffer circuit to said first write-in circuit in the absence of said multi-bit control signal but transfer the data bit to the second write-in circuit when the erasable programmable read only memory device is shifted into the write-in mode of operation; and (n) a mode signal producing circuit operative to produce a mode signal representative of said diagnostic mode of operation when said erasable programmable read only memory device is shifted into the diagnostic mode of operation, wherein at least one of said input data distributing circuits is responsive to the mode signal and transfer the data bit stored in said input/output data buffer circuit to both of said first and second write-in circuits.

2. An erasable programmable read only memory device as set forth in claim 1, in which each of said input data distributing circuits is provided with a control section responsive to said multi-bit control signal and said mode signal for deciding the destination of said data bit and a shifting section operative to transfer said data bit to both of said first and second write-in circuits or either first or second write-in circuit.

3. An erasable programmable read only memory device as set forth in claim 2, in which said control section comprises a first NAND gate supplied at the input nodes thereof with said multi-bit control signal, a first inverter circuit supplied at the input node thereof with said mode signal, a second NAND gate coupled at the input nodes thereof to the output nodes of the first NAND gate and the first inverter circuit, a second inverter circuit coupled at the input node thereof to the output node of the second NAND gate, and a third NAND gate coupled at the input nodes thereof to the output nodes of the second NAND gate and the first inverter circuit.

4. An erasable programmable read only memory device as set forth in claim 3, in which said shifting section comprises a first transfer gate provided with an n-channel type field effect transistor and a p-channel type field effect transistor respectively gated by the second NAND gate and the second inverter circuit for establishing or blocking a data path between said input/output data buffer circuit and said second write-in circuit, a third inverter circuit coupled at the input node thereof to said input/output data buffer circuit, and a fourth NAND gate coupled at the input nodes thereof to the output nodes of the third inverter circuit and the third NAND gate for transferring the data bit to said first write-in circuit.

5. An erasable programmable read only memory device as set forth in claim 1, in which at least one of said output data selecting circuits is responsive to said multi-bit control signal and said mode signal to transfer the data bit supplied from either first or second sense amplifier circuit to said input/output data buffer circuit.

6. An erasable programmable read only memory device as set forth in claim 5, in which each of said input data distributing circuits is provided with a control section and a shifting section.

7. An erasable programmable read only memory device as set forth in claim 6, in which said control section comprises a fifth NAND gate supplied with said multi-bit control signal, a fourth inverter circuit supplied with one bit of said multi-bit control signal, a fifth inverter circuit supplied with said mode signal, sixth NAND gate coupled at the input nodes thereof to the output nodes of the fifth NAND gate and the fifth inverter circuit, a sixth inverter circuit coupled to the output node of the sixth inverter circuit, and a seventh NAND gate coupled at the input nodes thereof to the fourth and fifth inverter circuits.

8. An erasable programmable read only memory device as set forth in claim 7, in which said shifting section comprises a series combination of a seventh inverter circuit and a eighth NAND gate coupled between said input/output data buffer circuit and said first write-in circuit, a second transfer gate coupled between the input/output data buffer circuit and said second write-in circuit and gated by said sixth inverter circuit and said sixth NAND gate, a prohibiting transistor coupled between a source of voltage and said second write-in circuit and gated by said seventh NAND gate for shifting the second write-in circuit into an inactive state, wherein said eighth NAND gate is coupled to the output node of said fifth NAND gate so as to be shifted between an active state and an inactive state.

9. An erasable programmable read only memory device as set forth in claim 8, in which said output data selecting circuit comprises a third transfer gate coupled between said input/output data buffer circuit and said second sense amplifier circuit and gated by said sixth inverter circuit and said sixth NAND gate, and a fourth transfer gate coupled between the input/output data buffer circuit and said first sense amplifier circuit and gated by said sixth NAND gate and said sixth inverter circuit.

* * * * *

UNITED STATES PATENT AND TRADEMARK OFFICE
CERTIFICATE OF CORRECTION

PATENT NO. : 4,881,200
DATED : November 14, 1989
INVENTOR(S) : Takahiko Urai

It is certified that error appears in the above-identified patent and that said Letters Patent is hereby corrected as shown below:

Column 11, line 23, delete "gate 15", and insert --gate 75--.

Signed and Sealed this

First Day of January, 1991

Attest:

HARRY F. MANBECK, JR.

*Attesting Officer*  *Commissioner of Patents and Trademarks*